(12) United States Patent
Hiramatsu et al.

(10) Patent No.: US 11,848,658 B2
(45) Date of Patent: Dec. 19, 2023

(54) ACOUSTIC WAVE RESONATOR WITH MASS LOADING STRIP FOR SUPPRESSION OF HYPERBOLIC MODE

(71) Applicant: Skyworks Solutions, Inc., Irvine, CA (US)

(72) Inventors: Yuya Hiramatsu, Neyagawa (JP); Rei Goto, Osaka (JP); Yumi Torazawa, Takatsuki (JP)

(73) Assignee: Skyworks Solutions, Inc., Irvine, CA (US)

( * ) Notice: Subject to any disclaimer, the term of this patent is extended or adjusted under 35 U.S.C. 154(b) by 694 days.

(21) Appl. No.: 17/075,039

(22) Filed: Oct. 20, 2020

(65) Prior Publication Data
US 2021/0126612 A1 Apr. 29, 2021

Related U.S. Application Data

(60) Provisional application No. 62/925,473, filed on Oct. 24, 2019, provisional application No. 62/925,426, filed on Oct. 24, 2019.

(51) Int. Cl.
| | |
|---|---|
| *H03H 9/02* | (2006.01) |
| *H03H 9/25* | (2006.01) |
| *H03H 9/145* | (2006.01) |
| *H03H 9/64* | (2006.01) |
| *H03F 3/24* | (2006.01) |
| *H03H 9/72* | (2006.01) |

(52) U.S. Cl.
CPC ......... *H03H 9/02889* (2013.01); *H03F 3/245* (2013.01); *H03H 9/02559* (2013.01); *H03H 9/02834* (2013.01); *H03H 9/02992* (2013.01); *H03H 9/145* (2013.01); *H03H 9/1457* (2013.01); *H03H 9/14541* (2013.01); *H03H 9/25* (2013.01); *H03H 9/6406* (2013.01); *H03H 9/6489* (2013.01); *H03H 9/725* (2013.01); *H03F 2200/451* (2013.01)

(58) Field of Classification Search
None
See application file for complete search history.

(56) References Cited

U.S. PATENT DOCUMENTS

| | | |
|---|---|---|
| 6,848,295 B2 | 2/2005 | Auner et al. |
| 7,322,243 B2 | 1/2008 | Liu et al. |
| 8,143,681 B2 | 3/2012 | Zaghloul et al. |
| 8,436,509 B1 | 5/2013 | Branch |
| 9,160,299 B2 | 10/2015 | Goto et al. |
| 9,257,960 B2 | 2/2016 | Ruile et al. |
| 9,673,779 B2 | 6/2017 | Ruile et al. |

(Continued)

*Primary Examiner* — Emily P Pham
(74) *Attorney, Agent, or Firm* — Knobbe, Martens, Olson & Bear LLP

(57) ABSTRACT

Aspects of this disclosure relate to an acoustic wave resonator with hyperbolic mode suppression. The acoustic wave resonator can include a piezoelectric layer, an interdigital transducer electrode, a temperature compensation layer, and a mass loading strip. The mass loading strip can be a conductive strip. The mass loading strip can overlap edge portions of fingers of the interdigital transducer electrode. A layer of the mass loading strip can have a density that is at least as high as a density of a material of the interdigital transducer electrode. The material of the interdigital transducer can impact acoustic properties of the acoustic wave resonator.

24 Claims, 13 Drawing Sheets

(56) References Cited

U.S. PATENT DOCUMENTS

| | | |
|---|---|---|
| 9,906,206 B2 | 2/2018 | Shih et al. |
| 2006/0032312 A1 | 2/2006 | Auner et al. |
| 2008/0094309 A1* | 4/2008 | Pance .................. H01Q 9/0485 343/911 R |
| 2017/0155373 A1 | 6/2017 | Ruby et al. |
| 2018/0062611 A1 | 3/2018 | Ha et al. |
| 2020/0162052 A1 | 5/2020 | Matsuoka et al. |
| 2020/0212876 A1 | 7/2020 | Goto et al. |
| 2021/0126616 A1 | 8/2021 | Hiramatsu et al. |

\* cited by examiner

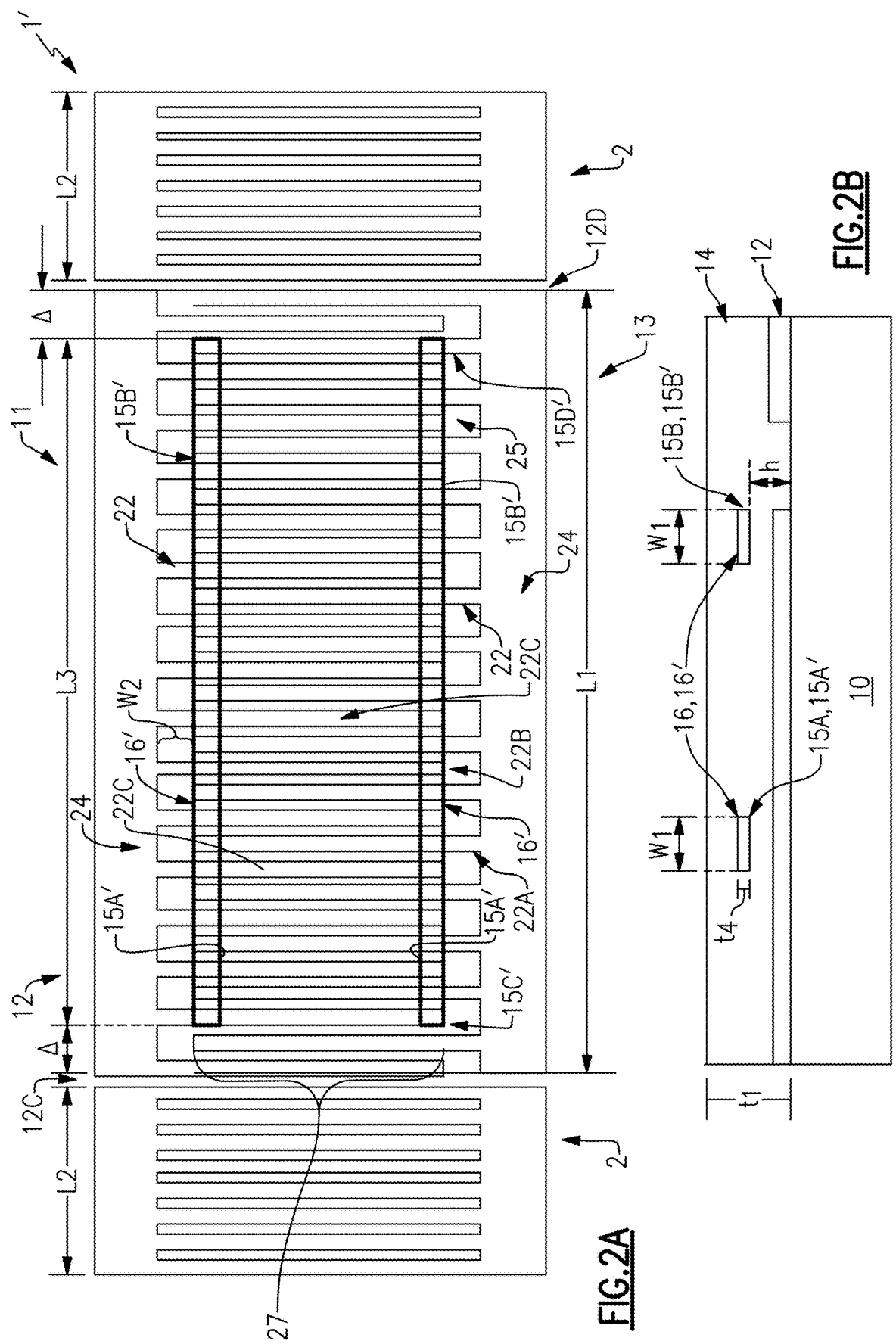

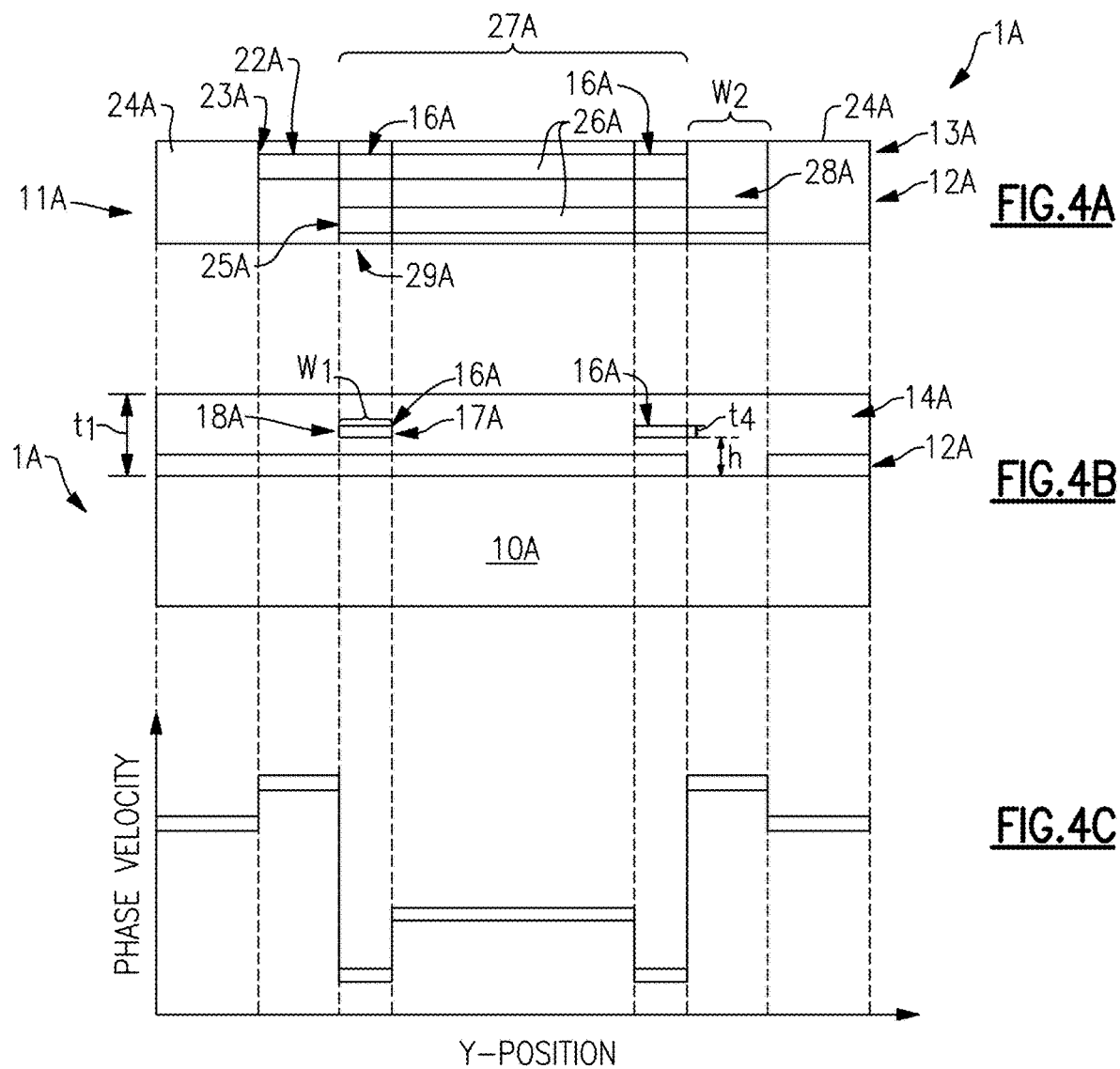

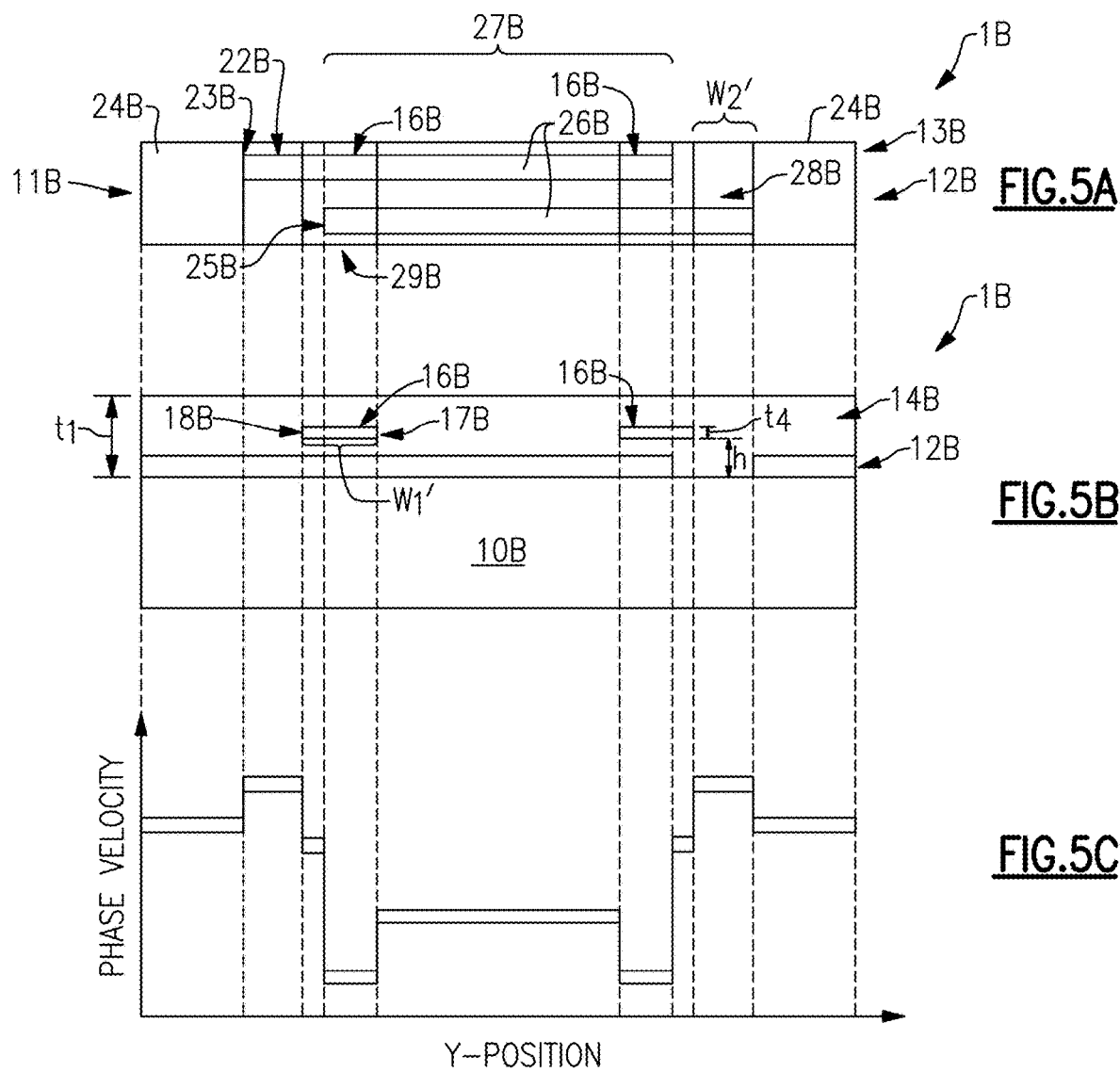

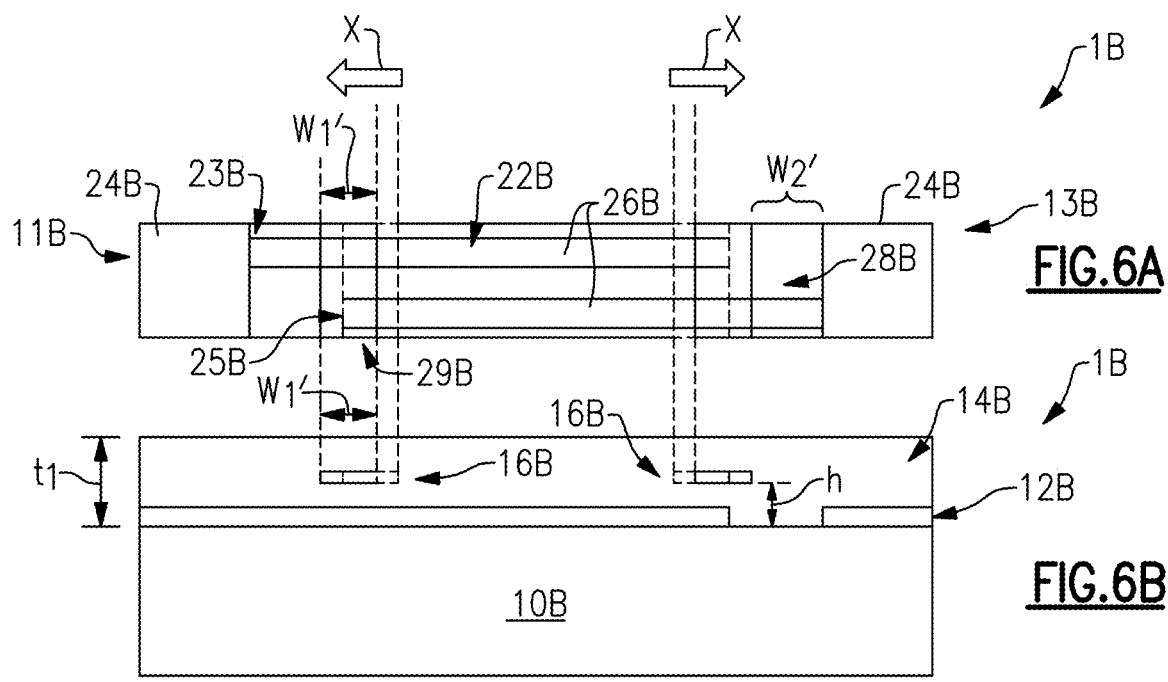

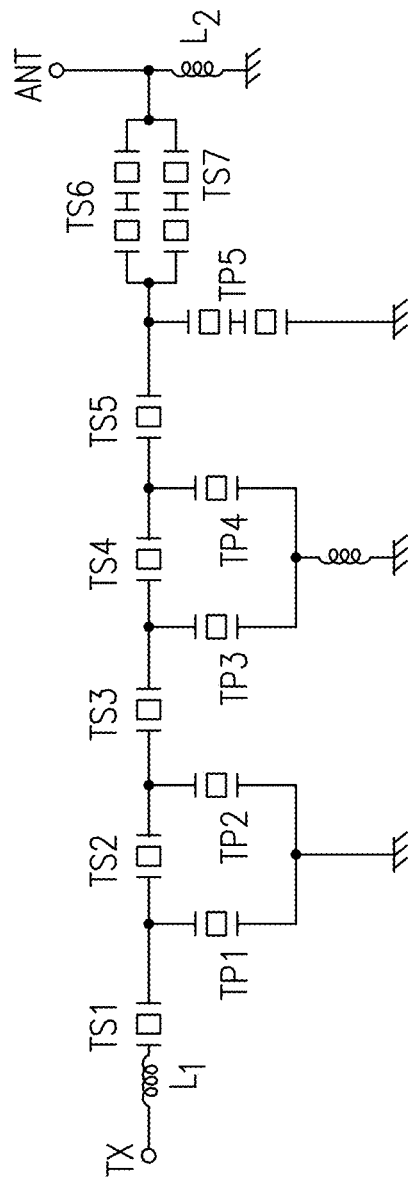
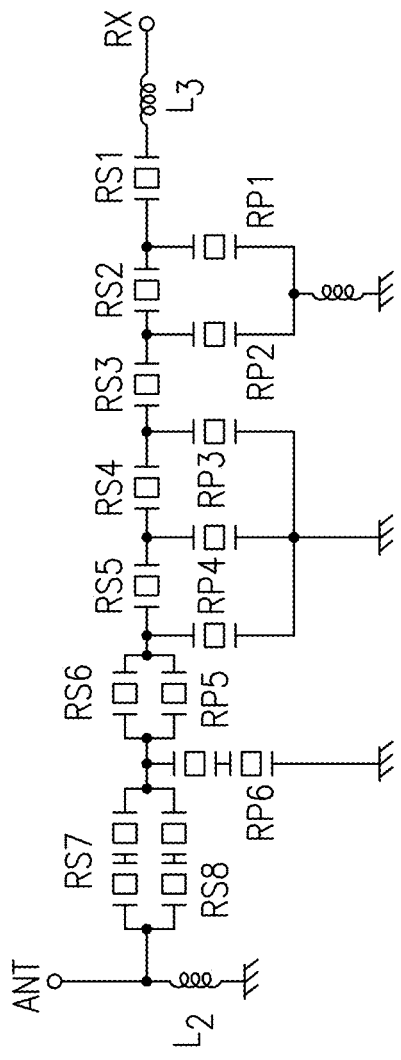
FIG.8
FIG.9

ACOUSTIC WAVE RESONATOR WITH MASS LOADING STRIP FOR SUPPRESSION OF HYPERBOLIC MODE

BACKGROUND

Technical Field

Embodiments of this disclosure relate to acoustic wave resonators with a conductive strip for hyperbolic mode suppression.

Description of Related Technology

Piezoelectric microelectromechanical systems (MEMS) resonators can be used in radio frequency systems. Piezoelectric MEMS resonators can process electrical signals using mechanically vibrating structures. Example piezoelectric MEMS resonators include surface acoustic (SAW) resonators and temperature compensated surface acoustic wave (TC-SAW) resonators.

Acoustic wave filters can include TCSAW resonators. Acoustic wave filters can filter radio frequency signals in radio frequency electronic systems. For instance, filters in a radio frequency front end of a mobile phone can include acoustic wave filters. Multiple acoustic wave filters can be arranged as a multiplexer, such as a duplexer.

BRIEF DESCRIPTION OF THE DRAWINGS

Embodiments of this disclosure will now be described, by way of non-limiting example, with reference to the accompanying drawings.

FIG. 2A illustrates a top view of a surface acoustic wave (SAW) resonator according to an embodiment.

FIG. 2B illustrates a cross-sectional view of the surface acoustic wave (SAW) resonator of FIG. 1 or FIG. 2A.

FIG. 4A illustrates a partial top view of a conventional SAW resonator, according to another embodiment.

FIG. 4B illustrates a cross-sectional view of the SAW resonator in FIG. 4A.

FIG. 4C is a graph showing the phase velocity versus Y position for the SAW resonator in FIG. 4A.

FIG. 5A illustrates a partial top view of a SAW resonator, according to another embodiment.

FIG. 5B illustrates a cross-sectional view of the SAW resonator in FIG. 5A.

FIG. 5C is a graph showing the phase velocity versus Y position for the SAW resonator in FIG. 5A.

FIG. 6A illustrates a partial top view of a SAW resonator, showing a variation in the width and location of conductive strips of the SAW resonator.

FIG. 6B illustrates a cross-sectional view of the SAW resonator of FIG. 6A.

FIG. 8 is a schematic diagram of a transmit filter that includes a surface acoustic wave resonator according to an embodiment.

FIG. 9 is a schematic diagram of a receive filter that includes a surface acoustic wave resonator according to an embodiment.

DETAILED DESCRIPTION OF CERTAIN EMBODIMENTS

Figure 1:
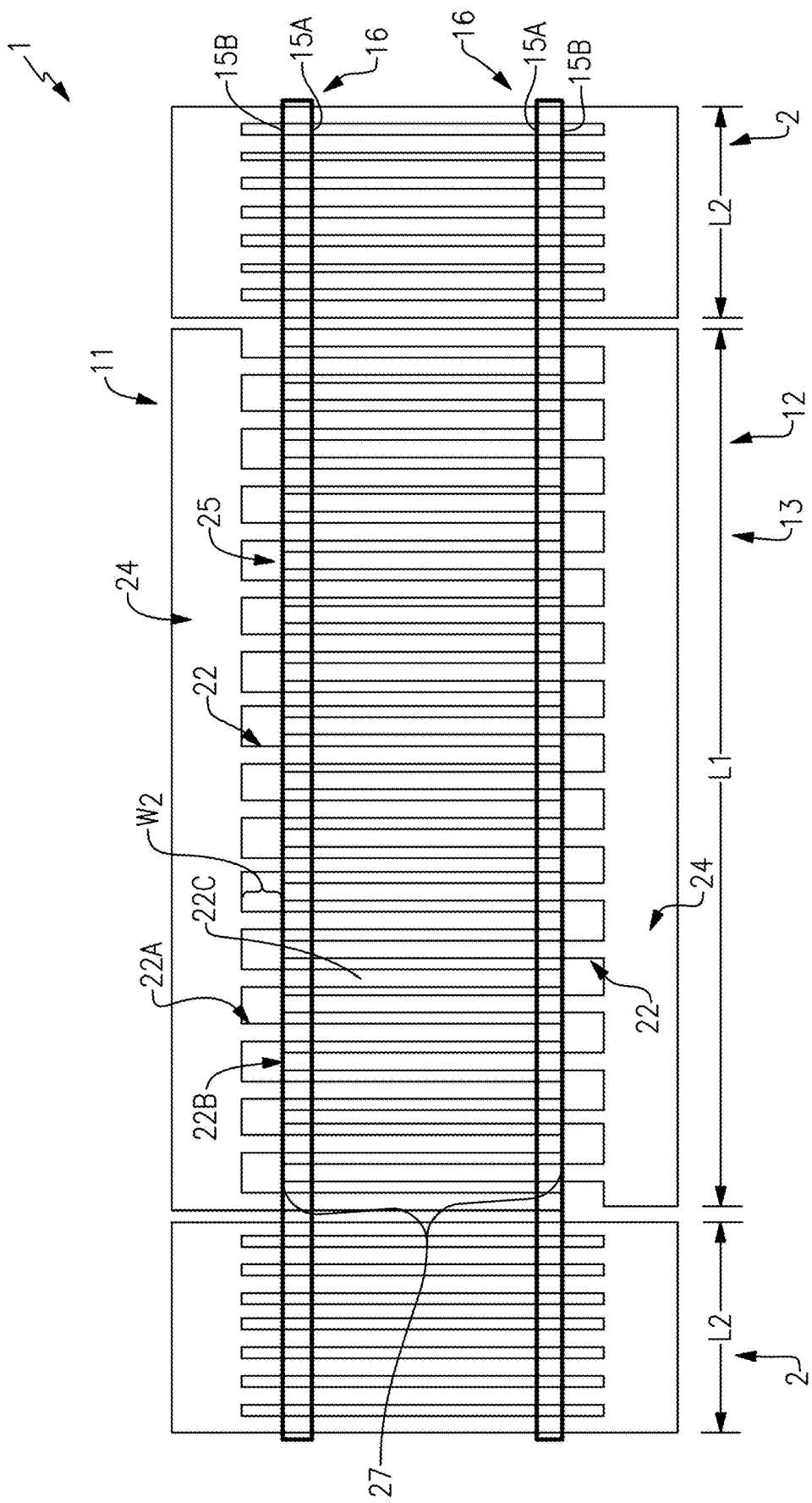
FIG. 1 illustrates a top view of a surface acoustic wave (SAW) resonator according to an embodiment.

The following description of certain embodiments presents descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The SAW devices may be referred as SAW resonators.

In general, high quality factor (Q), large effective electromechanical coupling coefficient ($k^2_{eff}$), high frequency ability, and spurious free can be significant aspects for micro resonators to enable low-loss filters, stable oscillators, and sensitive sensors. SAW resonators can have a relatively strong transverse mode in and/or near a pass band. The presence of the relatively strong transverse modes can hinder the accuracy and/or stability of oscillators and sensors, as well as hurt the performance of acoustic wave filters by creating relatively severe passband ripples and possibly limiting the rejection.

Therefore, transverse mode suppression is significant for SAW resonators. A technical solution for suppressing transverse modes is to create a border region with a different frequency from active region according to the mode dispersion characteristic. This can be referred to as a "piston mode." A piston mode can be obtained to cancel out the transverse wave vector in a lateral direction without significantly degrading the $k^2$ or Q. By including a relatively small border region with a slower velocity on the edge of the acoustic aperture of a SAW resonator, a propagating mode can have a zero (or approximately zero) transverse wave vector in the active aperture.

One way of achieving piston mode is to include a material that can cause a magnitude of the velocity in the underlying region of the SAW resonator to be increased. The material can be, for example, silicon nitride (SiN). As an example, SiN can be positioned over a center region of an interdigital transducer (IDT) electrode and the border region of the IDT can be free from the SiN.

A relatively high density IDT electrode, such as platinum (Pt) IDT, can be used for downsizing by slowing down the SAW propagation velocity of a temperature-compensated SAW (TCSAW) resonator. Transverse mode suppression can be significant for TCSAW device performance. However, a TCSAW resonator with an IDT that includes a relatively high density material can encounter difficulty in suppressing transverse modes. For instance, a silicon nitride layer with a trench over a temperature compensation layer for piston mode may not sufficiently suppress transverse modes in such resonators. This can be due to resonator displacement being distributed deep inside a silicon dioxide (SiO2) temperature compensation layer of the TCSAW resonator.

Another way to achieve piston mode is to provide a mass loading strip on edges of an IDT electrode active regions of the SAW resonator. The transverse wave vector can be real in the border region and imaginary on a gap region. A piston mode SAW resonator can have even order modes that have a multiple of full wave lengths in the active region, which should not significantly couple to electrical domain.

An IDT electrode with a tungsten layer has a relatively high density. Acoustic energy can be gathered into the IDT side. In that case, the perturbation on a surface of a silicon dioxide temperature compensation layer over the IDT electrode can be ineffective. A mass loading strip buried in the silicon dioxide temperature compensated layer that includes a tungsten layer can effectively control the velocity of a TCSAW resonator with an IDT electrode that includes tungsten. The combination of the conductive strip material and the IDT electrode material can be significant. For example, a conductive strip with a molybdenum layer may not sufficiently suppress transverse modes in a TCSAW resonator with an IDT electrode that includes tungsten. The conductive strip can include layer having a density that is at least as high as a density of a material of the IDT electrode that is in contact with a piezoelectric layer or the TCSAW resonator.

Aspects of this disclosure relate to SAW resonators (e.g., TCSAW resonators) that include a metal strip that includes a relatively high density metal layer. The metal strip can be buried in a temperature compensation layer, such as a silicon dioxide layer. The high density layer has a density at least as high as a density of a material of an IDT electrode that is in contact with the IDT electrode.

Hyperbolic Mode Suppression

FIG. 1 illustrates a top view of a surface acoustic wave (SAW) resonator 1 according to an embodiment. The SAW resonator 1 includes an interdigital transducer (IDT) 12 having a length L1 with a pair of reflectors 2 on opposite ends of the IDT electrode 12, each of the reflectors 2 having a length L2. The IDT 12 is or includes a pair of IDT electrodes 11, 13. The SAW resonator 1 also includes one or more (e.g., a pair of) mass loading strips 16 that extend along the length of the IDT 12 and pair of reflectors 2 (e.g., the mass loading strips 16 extend along a length equal to L1+L2+L2). In one example, the mass loading strips 16 can be conductive strips (e.g., made of metal). In another example, the mass loading strips 16 can be a heavy strip of dielectric material.

FIG. 2A illustrates a top view of a surface acoustic wave (SAW) resonator 1' according to another embodiment. The SAW resonator 1' includes an interdigital transducer (IDT) 12 having a length L1 with a pair of reflectors 2 on opposite ends of the IDT electrode 12, each of the reflectors 2 having a length L2. The IDT 12 is or includes a pair of IDT electrodes 11, 13. The SAW resonator 1' also includes one or more (e.g., a pair of) mass loading strips 16'. The mass loading strip(s) 16' extend along a length L3 that is shorter than the length L1 of the IDT 12. In one implementation, each of the mass loading strip(s) 16' has proximal and distal ends 15C', 15D' that are each spaced from respective ends 12C, 12D of the IDT 12 by a gap distance Δ (e.g., the length L3 of the mass loading strip(s) 16' is equal to the length L1 of the IDT 12 minus twice the gap distance Δ, or L3=L1−2Δ). The length L3 of the mass loading strip(s) 16' can be shorter than the length L1 of the IDT 12 by (e.g., 2Δ equals) 1% or more of the length L1 of the IDT 12 (e.g., 2%, 4%, 6%, 8%, 10%, 15%, 20%). In one example, the mass loading strip(s) 16' can be conductive strips (e.g., made of metal). In another example, the mass loading strip(s) 16' can be a heavy strip of dielectric material.

With reference to FIG. 2B, the SAW resonator 1, 1' can in one implementation include a piezoelectric layer 10, the IDT 12 disposed over the piezoelectric layer 10, a temperature compensation layer 14 over the IDT 12, the mass loading strip(s) 16, 16' buried (e.g., embedded) in the temperature compensation layer 14. Optionally, a dispersion adjustment layer can be disposed over the temperature compensation layer 14. The dispersion adjustment layer can serve as a passivation layer. The illustrated mass loading strip(s) 16, 16' can include a high density metal strip layer. In one implementation, the mass loading strip(s) 16, 16' can be a multi-layer conductive strip. The mass loading strip(s) 16, 16' can implement piston mode.

The piezoelectric layer 10 can include any suitable piezoelectric layer 10, such as a lithium niobate (LN) layer or a lithium tantalate (LT) layer. A thickness of the piezoelectric layer 10 can be selected based on a wavelength λ or L of a surface acoustic wave generated by the surface acoustic wave (SAW) resonator 1, 1' in certain applications. The IDT electrode 12 has a pitch that sets the wavelength λ or L of the surface acoustic wave device 1, 1'. The piezoelectric layer 10 can be sufficiently thick to avoid significant frequency variation.

The illustrated IDT electrodes 11, 13 can in one implementation be a single layer electrode. In another implementation, the IDT electrodes 11, 13 can optionally be a multilayer electrode with a first layer (e.g., lower electrode layer) and a second layer (e.g., upper electrode layer). The first layer can impact acoustic properties of the SAW resonator 1, 1'. For instance, a thickness of the first layer of the IDT electrodes 11, 13 can impact resonant frequency of the surface acoustic wave device 1, 1'. The second layer of the IDT electrodes 11, 13 can impact electrical properties of the SAW resonator 1, 1'. A thickness of the second layer of the IDT electrodes 11, 13 can impact insertion loss of the SAW resonator 1, 1'. The thickness of the second layer of the IDT electrodes 11, 13 may not significantly impact acoustic properties of the SAW resonator 1, 1'.

The IDT electrodes 11, 13 of the IDT 12 each have fingers 22 and bus bars 24, which are illustrated in FIG. 1 (e.g., define two interlocking comb-shaped arrays of metallic electrodes). In some implementations, the IDT electrodes 11, 13 of the surface acoustic wave resonator 1, 1' includes separate IDT layers that impact acoustic properties and electrical properties, respectively. Accordingly, electrical properties, such as insertion loss, can be improved by adjusting one of the IDT layers without significantly impacting acoustic properties.

The IDT 12 can include any suitable material. For example, the IDT 12 may include one or more other metals, such as copper (Cu), Magnesium (Mg), titanium (Ti), molybdenum (Mo), tungsten (W), aluminum (Al), etc. The IDT 12 may include alloys, such as AlMgCu, AlCu, etc. Although embodiments disclosed herein include IDT electrodes 11, 13 with a single IDT layer, in other implementations the IDT electrodes 11, 13 can have more than one layer (e.g., two IDT layers, three IDT layers).

The temperature compensation layer 14 can include any suitable temperature compensation material. For example, the temperature compensation layer 14 can be a silicon dioxide ($SiO_2$) layer. The temperature compensation layer 14 can be a layer of any other suitable material having a positive temperature coefficient of frequency for SAW resonators with a piezoelectric layer having a negative coefficient of frequency. For instance, the temperature compensation layer 14 can be a tellurium dioxide ($TeO_2$) layer or a silicon oxyfluoride (SiOF) layer in certain applications. A temperature compensation layer 14 can include any suitable combination of $SiO_2$, $TeO_2$, and/or SiOF.

The temperature compensation layer 14 can bring the temperature coefficient of frequency (TCF) of the SAW resonator 1, 1' closer to zero relative to a similar SAW resonator without the temperature compensation layer 14. The temperature compensation layer 14 together with a lithium niobate piezoelectric layer 10 can improve the electromechanical coupling coefficient ($k^2$) of the SAW resonator 1, 1' relative to a similar SAW resonator with a lithium tantalate piezoelectric layer 10 and without the temperature compensation layer. This advantage of the temperature compensation layer 14 can be more pronounced when the SAW resonator 1, 1' includes an LN layer as the piezoelectric layer 10. The temperature compensation layer 10 has a thickness in a range from 0.1L to 0.5L. For instance, the thickness can be about 0.3L in certain applications. For example, when the wavelength L is 4 μm, the thickness of the temperature compensation layer 14 can be 1200 nm.

In some implementations of the illustrated SAW resonator 1, 1' of FIGS. 1-2B, an optional dispersion adjustment layer (not shown) can be disposed entirely over an upper surface of the temperature compensation layer 14. In one implementation the dispersion adjustment layer can be a SiN layer. However, a SiN layer may be partially disposed over the upper surface of the temperature compensation layer 14. In some instances, IDT electrodes 11, 13 can include fingers 22 having the SiN layer over an active region and border regions free from SiN. The SiN layer can cause a magnitude of the velocity in the underlying region of the SAW resonator 1, 1' to be increased. In certain applications, the dispersion adjustment layer can include another suitable material in place of an SiN layer to increase the magnitude of the velocity of the underlying region of the SAW resonator 1, 1'. According to some applications, the dispersion adjustment layer can include SiN and another material. The dispersion adjustment layer can also function as a passivation layer.

The IDT electrodes 11, 13 of the illustrated SAW resonator 1, 1' of FIGS. 1-2B include two bus bars 24 and sixteen fingers 22 extending from one of the bus bars 24 and sixteen fingers 22 extending from the other bus bar 24. Any suitable number of fingers for a particular application can extend from the bus bars 24. Each finger 22 has a proximate end 22A that is in contact with a bus bar 24 and a distal end 22B opposite the proximate end 22A. A body portion 22C of the finger 22 extends between the proximate end 22A and the distal end 22B. A portion near the distal end 22B can be referred as an edge portion. An aperture 27 of the SAW resonator 1, 1 can be defined by the region between distal ends 22B of fingers 22 extending from opposing bus bars 24.

In certain applications, the mass loading strip(s) 16, 16' can include a high density metal strip layer of any suitable metal that has a density that is equal to or greater than the density of a first layer (or the lower electrode layer) of the IDT electrodes 11, 13. The conductive or mass loading strip(s) 16 can include a layer having a density at least as high as a density of a material of said first layer. For example, the high density metal strip layer can include molybdenum (Mo), tungsten (W), gold (Au), silver (Ag), ruthenium (Ru), iridium (Ir), or the like, depending on the density of the first layer of the IDT electrodes 11, 13.

The mass loading strip(s) 16, 16' has an inner edge 15A, 15A' and an outer edge 15B, 15B'. The outer edge 15B, 15B' of the mass loading strip 16, 16' are illustrated as being aligned with the distal ends 22B of the fingers 22 having a gap 25 between the outer edge 15B, 15B' and the bus bar 24. However, in some embodiments, the mass loading strip 16, 16' can be arranged so that the outer edge 15B, 15B' can be located between the distal end 22B of the finger 22 that extends from one bus bar 24 and the other bus bar 24. In other embodiments, the outer edge 15B, 15B' may overlap with the bus bar 24 or be outside of the IDT 12. The mass loading strip 16, 16' has a width w1 from the inner edge 15A, 15A' to the outer edge 15B, 15B' of the mass loading strip 16, 16'. For example, the width w1 of the mass loading strip can be in a range from 0.5L to 1.5L. The gap 25 has a width w2 from the outer edge 15B, 15B' and the bus bar 24. For example, the width w2 of the gap can be greater than 0.9L.

The mass loading strip(s) 16, 16' has a thickness t4. The thickness t4 of the mass loading strip 16, 16' can be selected based on a wavelength λ, or L of a surface acoustic wave generated by the surface acoustic wave resonator 1, 1'. For example, the thickness t4 of the mass loading strip 16, 16' can be in a range from 0.01L to 0.03L in certain applications.

Advantageously, having the length L3 of the mass loading strip(s) 16' be shorter than the length L1 of the IDT 12 in the SAW resonator 1' facilitates the suppression of the hyperbolic mode. In one implementation, having the length L3 of the mass loading strips (s) 16' be shorter than the length L1 of the IDT 12 by at least between about 1% and about 10% of the length L1 of the IDT 12 (e.g., 0.005L1<Δ<0.05L1) allows the suppression of the hyperbolic mode in the SAW resonator 1' (as compared to the SAW resonator 1) without worsening admittance performance. Suppression of the hyperbolic mode can improve the filter pass band insertion loss characteristics.

A metal strip can include molybdenum to obtain mass loading for piston mode operation. However, molybdenum is not particularly adhesive and can experience delamination. Titanium has good adhesion. Titanium can also provide desirable polarization. However, titanium may not have sufficient mass loading desired for piston mode operation. A stacked molybdenum/titanium strip can be provided to obtain adherence and mass loading for piston mode operation in an acoustic wave resonator.

Aspects of this disclosure relate to SAW resonators (e.g., TC-SAW resonators) that include a metal strip that includes a high density metal layer and an adhesion layer. The metal strip can be buried in a temperature compensation layer, such as a silicon dioxide layer. The adhesion layer can provide an adhesion strength that can mitigate and/or prevent delamination of the metal strip from the temperature compensation layer. The high density layer can provide mass loading for piston mode operation.

Figure 2C:
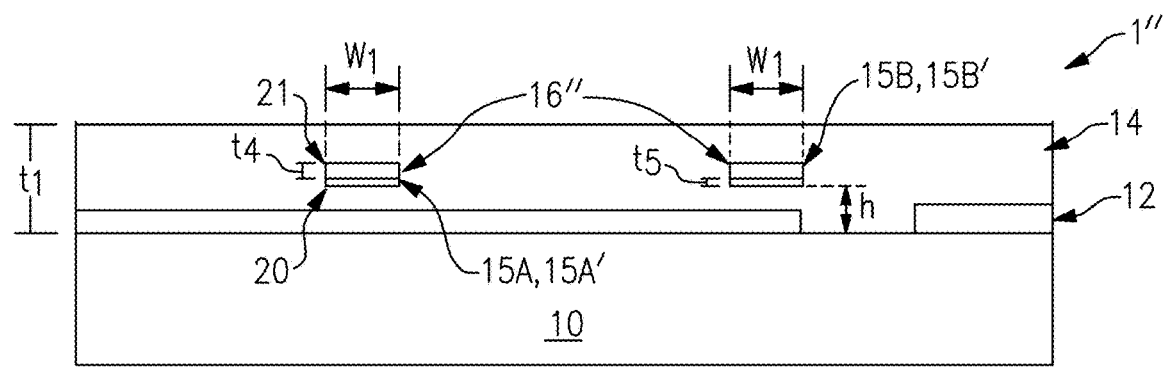
FIG. 2C illustrates a cross-sectional view of a surface acoustic wave (SAW) resonator of FIG. 2A.

FIG. 2C illustrates a cross section of a surface acoustic wave (SAW) resonator 1" according to an embodiment. The top view of the SAW resonator 1" can look similar to the SAW resonator 1' in FIG. 2A. The resonator 1" illustrated in FIG. 2C is generally similar to the resonator 1' illustrated in FIGS. 2A and 2B. However, unlike the metal strips 16' illustrated in FIGS. 2A and 2B, the metal strip 16" illustrated in FIG. 2C includes an adhesion layer 20. Accordingly, the metal strip 16" illustrated in FIG. 2C is a multi-layer or stacked conductive strip. The adhesion layer 20 of the metal strip 16" can provide a better adhesion with the temperature compensation layer 14 than the adhesion between the high density metal strip layer 21 with the temperature compensation layer 14. For example, the adhesion layer 20 can include titanium (Ti), titanium nitride (TiN), aluminum nitride (AlN), tantalum pentoxide ($Ta_2O_5$), or the like. Some materials, such as Ti, can provide a better polarization than a metal strip with different material for the adhesion layer 20 or without the adhesion layer 20. Accordingly, in certain applications, the adhesion layer 20 can be a titanium layer that provides desirable adhesion and desirable polarization. The metal strip 16" may be formed in any suitable manner. For example, the adhesion layer 20 may be provided over the temperature compensation layer 14 by way of deposition and the high density metal strip 21 may be provided over the adhesion layer 20 by way of deposition. For example, the metal strip 16" can be a high density metal/titanium strip, such as a molybdenum-titanium strip or a tungsten-titanium strip.

Figure 2D:
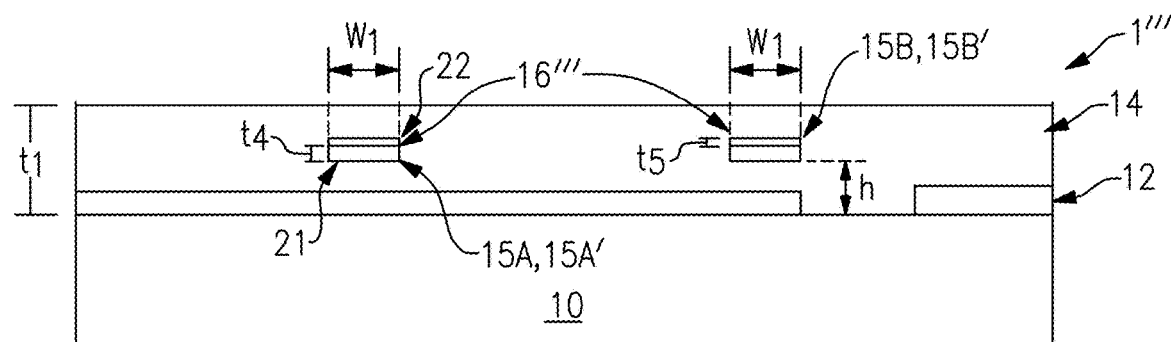
FIG. 2D illustrates a cross-sectional view of a surface acoustic wave (SAW) resonator of FIG. 2A.

FIG. 2D illustrates a cross section of a surface acoustic wave (SAW) resonator 1''' according to an embodiment. The top view of the SAW resonator 1''' can look similar to the SAW resonator 1' in FIG. 2A. The resonator 1' illustrated in FIG. 2D is generally similar to the resonator 1' illustrated in FIGS. 2A and 2B. However, unlike the metal strips 16' illustrated in FIGS. 2A and 2B, the metal strip 16''' illustrated in FIG. 2D includes an adhesion layer 22. Accordingly, the metal strip 16''' illustrated in FIG. 2D is a multi-layer or stacked conductive strip. The adhesion layer 20 of the metal strip 16''' can provide a better adhesion with the temperature compensation layer 14 than the adhesion between the high density metal strip layer 21 with the temperature compensation layer 14. For example, the adhesion layer 22 can include titanium (Ti), titanium nitride (TiN), aluminum nitride (AlN), tantalum pentoxide ($Ta_2O_5$), or the like. Some materials, such as Ti, can provide a better polarization than a metal strip with different material for the adhesion layer 22 or without the adhesion layer 22. Accordingly, in certain applications, the adhesion layer 22 can be a titanium layer that provides desirable adhesion and desirable polarization. The metal strip 16''' may be formed in any suitable manner. For example, the high density metal strip 21 may be provided over the temperature compensation layer 14 by way of deposition and the adhesion layer 22 may be provided over the high density metal strip 21 by way of deposition. For example, the metal strip 16''' can be a titanium/high density metal strip, such as a titanium-molybdenum strip or a titanium-tungsten strip.

The adhesion layer 20, 22 can have any suitable thickness t5 that can provide an improved adhesion as compared to the metal strip 16' without the adhesion layer 20, 22. For example, the thickness t5 can be less than 50 nm. In certain embodiments, the thickness t5 of the adhesion layer 20, 22 can be in a range from 5 nm to 50 nm to provide an improved polarization.

Figure 2E:
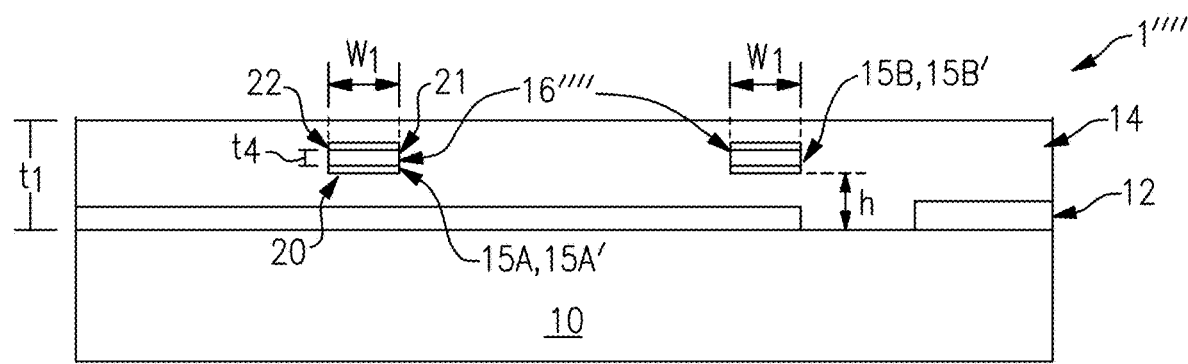
FIG. 2E illustrates a cross-sectional view of a surface acoustic wave (SAW) resonator of FIG. 2A.

FIG. 2E illustrates a cross section of a surface acoustic wave (SAW) resonator 1'''' according to an embodiment. The top view of the SAW resonator 1'''' can look similar to the SAW resonator 1' in FIG. 2A. The resonator 1'''' illustrated in FIG. 2E is generally similar to the resonator 1' illustrated in FIGS. 2A and 2B. However, unlike the metal strip 16' illustrated in FIGS. 2A and 2B, the metal strip 16'''' illustrated in FIG. 2E includes three layers and is therefore a multi-layer or stacked conductive strip. A multi-layer metal strip or stacked conductive strip in accordance with the principles and advantages disclosed herein can include more than three layers in some other embodiments.

As illustrated in FIG. 2E, the metal strip 16'''' includes a first layer (e.g., an adhesion layer 20), a second layer (e.g., a high density metal strip layer 21), and a third layer 22. The third layer 22 can be a second adhesion layer. This can provide a better adhesion with the temperature compensation layer 14 than the adhesion between the high density metal strip layer 21 with the temperature compensation layer 14. The second adhesion layer can be a titanium layer. In certain instances, the adhesion layer 20 and the second adhesion layer 22 can be of the same material. For example, the metal strip 16'''' can be a titanium/high density metal/titanium strip, such as a titanium-molybdenum-titanium strip or a titanium-tungsten-titanium strip. The second adhesion layer can include titanium nitride (TiN), aluminum nitride (AlN), tantalum pentoxide ($Ta_2O_5$), or the like in some other instances.

In some other embodiments, a multi-layer conductive strip can include two or more layers of high density metal. The high density metal layers can be of different high density material. Example high density metals include molybdenum (Mo), tungsten (W), gold (Au), silver (Ag), ruthenium (Ru), copper (Cu), platinum (Pt), iridium (Ir) or the like.

The conductive strips disclosed herein can be disposed at any suitable position that is a distance r from the piezoelectric layer 10 (or from the lower surface of the temperature compensation layer 14). The distance r may be selected relative to the thickness t1 of the temperature compensation layer 14. For example, the distance r can be in a range from 0.2×t1 to 0.8×t1 in some embodiments, in which t1 is the thickness of the temperature compensation layer 14. When the dispersion adjustment layer is disposed over the temperature compensation layer 14, it may be preferable for the distance r to be in a range from 0.4×t1 to 0.6×t1.

In some other embodiments, a multi-layer conductive strip can include two or more layers of high density metal. The high density metal layers can be of different high density material. Example high density metals include molybdenum (Mo), tungsten (W), gold (Au), silver (Ag), ruthenium (Ru), copper (Cu), platinum (Pt), iridium (Ir) or the like.

Figure 3A:
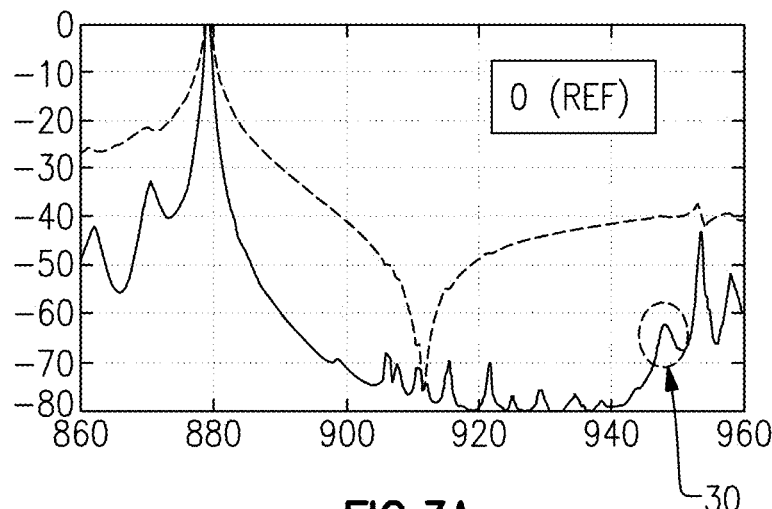
FIG. 3A is a graph showing a measured admittance of the SAW resonator in FIG. 1.

FIG. 3A is a graph showing measurement of admittance of the SAW resonator 1 of FIG. 1 with a plot of dB(|Y|) (e.g., dashed line in graph) and a plot of dB(real{Y}) (e.g., solid line in graph), versus frequency. In FIG. 3A, the hyperbolic mode response is more pronounced in the plot of dB(real{Y}), where a hyperbolic mode is observed for the measurement 30.

Figure 3B:
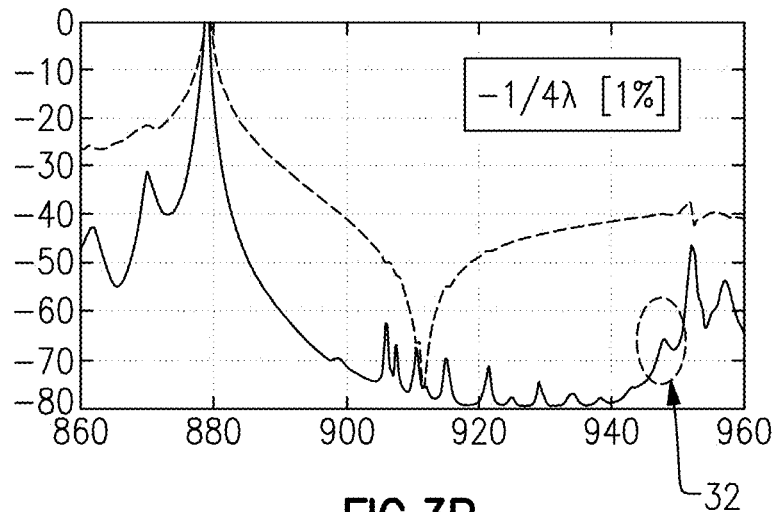
FIG. 3B is a graph showing a measured admittance of a SAW resonator according to another embodiment compared to the measured admittance in FIG. 3A.
Figure 3C:
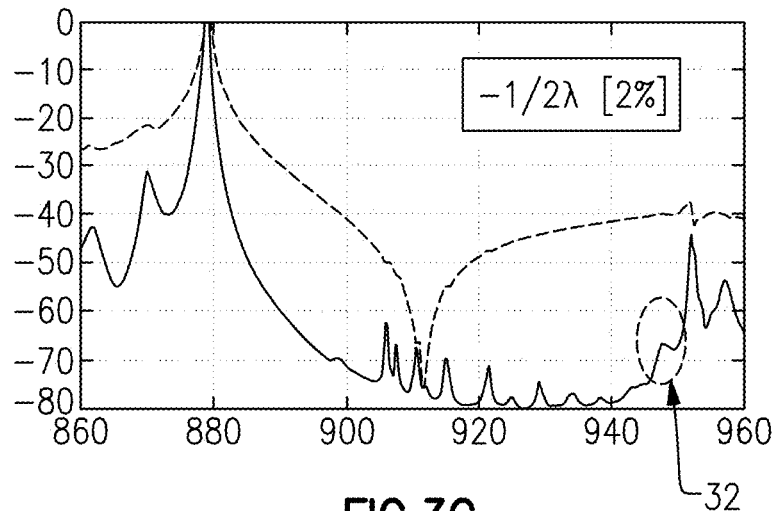
FIG. 3C is a graph showing a measured admittance of a SAW resonator according to another embodiment compared to the measured admittance in FIG. 3A.
Figure 3D:
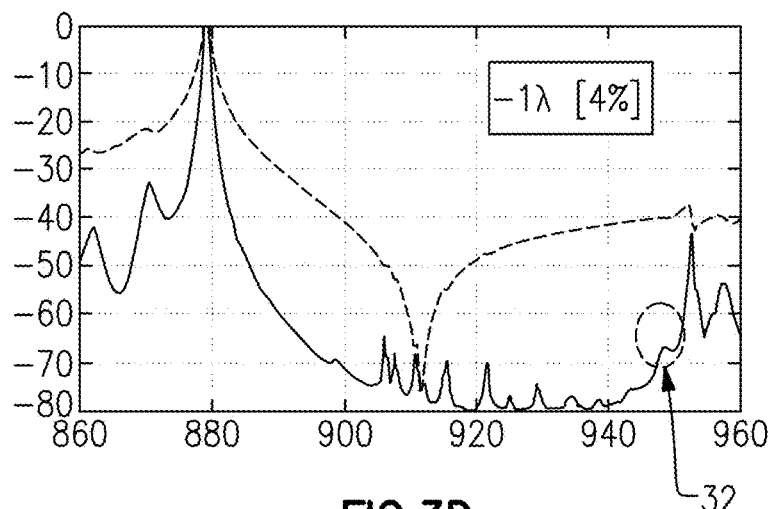
FIG. 3D is a graph showing a measured admittance of a SAW resonator according to another embodiment compared to the measured admittance in FIG. 3A.
Figure 3E:
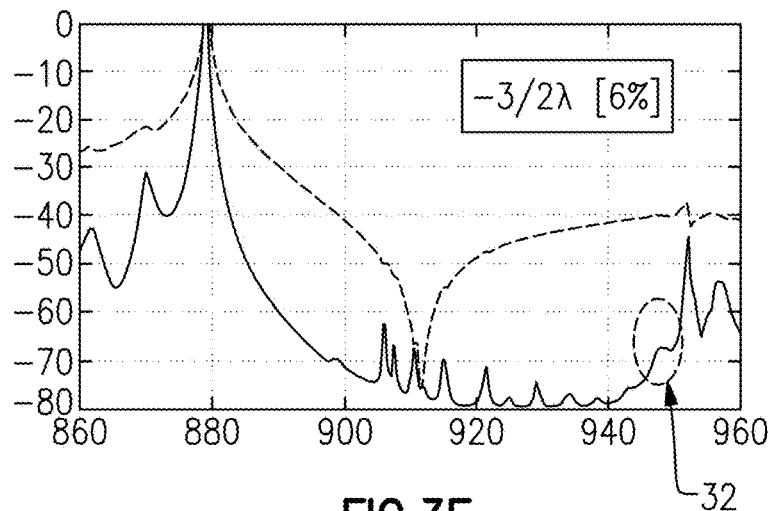
FIG. 3E is a graph showing a measured admittance of a SAW resonator according to another embodiment compared to the measured admittance in FIG. 3A.
Figure 3F:
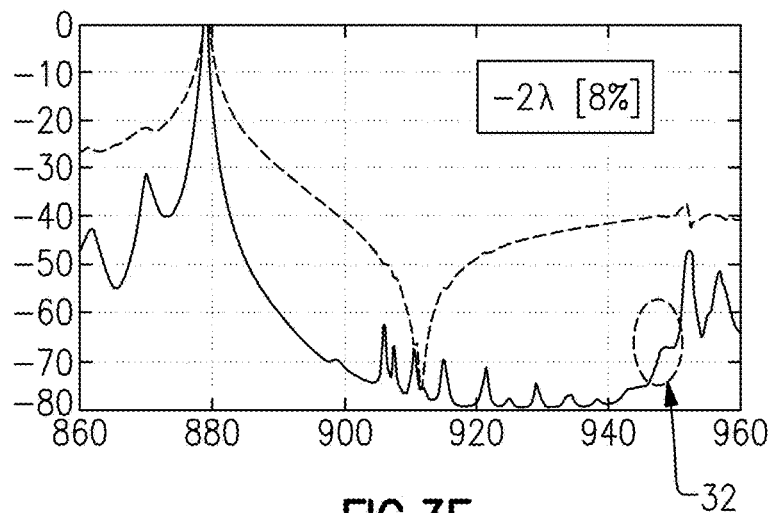
FIG. 3F is a graph showing a measured admittance of a SAW resonator according to another embodiment compared to the measured admittance in FIG. 3A.
Figure 3G:
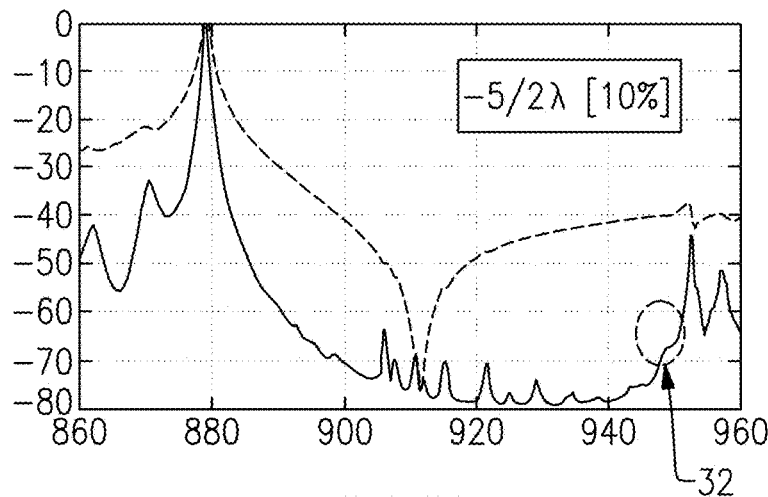
FIG. 3G is a graph showing a measured admittance of a SAW resonator according to another embodiment compared to the measured admittance in FIG. 3A.
Figure 3H:
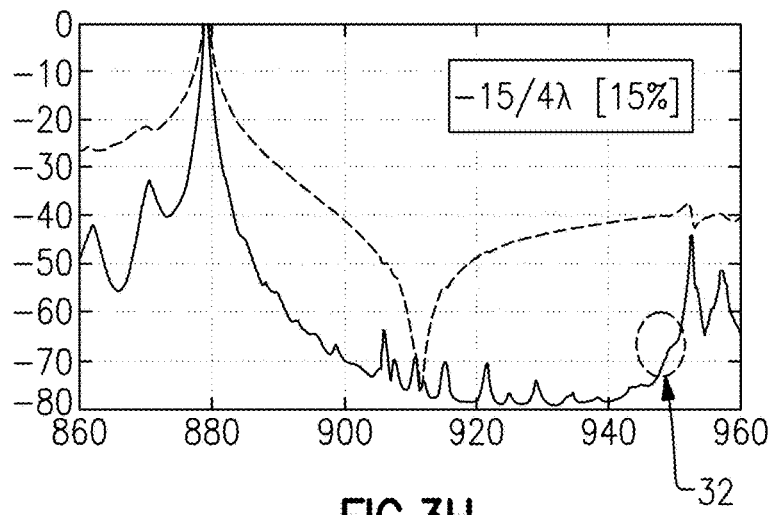
FIG. 3H is a graph showing a measured admittance of a SAW resonator according to another embodiment compared to the measured admittance in FIG. 3A.
Figure 3I:
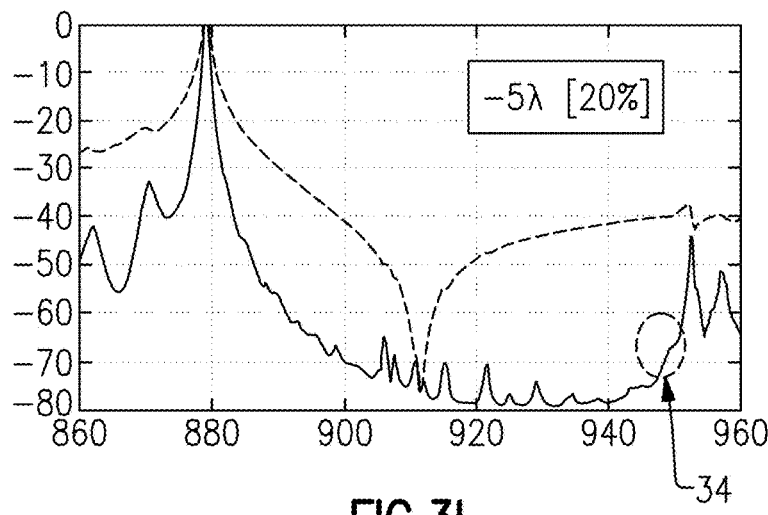
FIG. 3I is a graph showing a measured admittance of a SAW resonator according to another embodiment compared to the measured admittance in FIG. 3A.

FIGS. 3B-3I are graphs showing measurement of admittance of the SAW resonator 1' of FIG. 2A-2B for certain embodiments of the SAW resonator 1' based on the difference (e.g., 2×Δ) between the length L3 of the mass loading strip(s) 16' and the length L1 of the IDT 12. FIGS. 3B-3I each show a plot of dB(|Y|) (e.g., dashed line in graph) and a plot of dB(real{Y}) (e.g., solid line in graph) versus frequency for these embodiments, as compared with the measurements in FIG. 3A for the measured admittance of the SAW resonator 1. FIG. 3B is a graph of dB(|Y|) and of dB(real{Y}) for the SAW resonator 1' where the mass loading strip(s) 16' has a length L3 that is 1% shorter than the length L1 of the IDT 12 (e.g., L3=0.99×L1). FIG. 3C is a graph of dB(|Y|) and of dB(real{Y}) for the SAW resonator 1' where the mass loading strip(s) 16' has a length L3 that is 2% shorter than the length L1 of the IDT electrode 12 (e.g., L3=0.98×L1). FIG. 3D is a graph of dB(|Y|) and of dB(real{Y}) for the SAW resonator 1' where the mass loading strip(s) 16' has a length L3 that is 4% shorter than the length L1 of the IDT 12 (e.g., L3=0.96×L1). FIG. 3E is a graph of dB(|Y|) and of dB(real{Y}) for the SAW resonator 1' where the mass loading strip(s) 16' has a length L3 that is 6% shorter than the length L1 of the IDT 12 (e.g., L3=0.94×L1). FIG. 3F is a graph of dB(|Y|) and of dB(real{Y}) for the SAW resonator 1' where the mass loading strip(s) 16' has a length L3 that is 8% shorter than the length L1 of the IDT 12 (e.g., L3=0.92×L1). FIG. 3G is a graph of dB(|Y|) and of dB(real{Y}) for the SAW resonator 1' where the mass loading strip(s) 16' has a length L3 that is 10% shorter than the length L1 of the IDT 12 (e.g., L3=0.90×L1). FIG. 3H is a graph of dB(|Y|) and of dB(real{Y}) for the SAW resonator 1' where the mass loading strip(s) 16' has a length L3 that is 15% shorter than the length L1 of the IDT 12 (e.g., L3=0.85×L1). FIG. 3I is a graph of dB(|Y|) and of dB(real{Y}) for the SAW resonator 1' where the mass loading strip(s) 16' has a length L3 that is 20% shorter than the length L1 of the IDT 12 (e.g., L3=0.80×L1).

With reference to FIGS. 3B-3I, certain embodiments of the SAW resonator 1' provide an improvement in the suppression of the hyperbolic mode as compared to the measurement of admittance for the SAW resonator 1, as shown by measurement 32 in FIGS. 3B-3I. For example, where the length L3 of the mass loading strip(s) 16' is between about 4% and about 10/% shorter than the length L1 of the IDT 12, suppression of the hyperbolic mode is achieved without adverse effects on the admittance measurements. As shown in FIG. 3I, though the hyperbolic mode is completely suppressed, as shown by measurement 34, other characteristics of the admittance measurements (e.g., as shown by measurement 36) are made worse.

Transverse Mode Suppression

FIGS. 4A-4B illustrate a conventional SAW resonator 1A. FIG. 4A illustrates a top view of a portion of the SAW resonator 1A. FIG. 4B illustrates a cross-sectional view of the SAW resonator 1A. FIG. 4C shows a graph of phase velocity versus y-position for the SAW resonator 1A.

The SAW resonator 1A has an interdigital transducer (IDT) 12A and one or more (e.g., a pair of) mass loading strips 16A. The IDT 12A is or includes a pair of IDT electrodes 11A, 13A. The dashed lines between the top view in FIG. 4A and the cross-sectional view in FIG. 4B show relative positions of the illustrated components.

The IDT electrodes 11A, 13A of the IDT 12A each have a bus bar 24A and fingers 22A extending from the bus bar 24A (e.g., define two interlocking comb-shaped arrays of metallic electrodes). Any suitable number of fingers 22A for a particular application can extend from the bus bars 24A. In one example, the IDT electrodes 11A, 13A can have the same number of fingers 22A as in the SAW resonator 1, 1' described above. Each finger 22A has a proximate end 23A that is in contact with a bus bar 24A and a distal end 25A opposite the proximate end 23A. A body portion 26A of the finger 22A extends between the proximate end 23A and the distal end 25A. A portion near the distal end 25A can be referred as an edge portion 29A. An aperture 27A of the SAW resonator 1A can be defined by the region between distal ends 25A of fingers 22A extending from opposing bus bars 24A.

With reference to FIG. 4B, the SAW resonator 1A can in one implementation include a piezoelectric layer 10A, the IDT 12A disposed over the piezoelectric layer 10A, a temperature compensation layer 14A over the IDT 12A, the mass loading strip(s) 16A buried (e.g., embedded) in the temperature compensation layer 14A. Optionally a dispersion adjustment layer (not shown) can be disposed over the temperature compensation layer 14A. The dispersion adjustment layer can serve as a passivation layer. The illustrated mass loading strip(s) 16A can include a high density metal strip layer. In one implementation, the mass loading strip(s) 16A can be a multi-layer or stacked conductive strip, as discussed above in connection with FIGS. 2C-2E. The mass loading strip(s) 16A can implement piston mode.

The piezoelectric layer 10A can include any suitable piezoelectric layer 10A, such as a lithium niobate (LN) layer or a lithium tantalate (LT) layer. A thickness of the piezoelectric layer 10A can be selected based on a wavelength λ or L of a surface acoustic wave generated by the surface acoustic wave (SAW) resonator 1A in certain applications. The IDT 12A has a pitch that sets the wavelength λ or L of the surface acoustic wave device 1A. The piezoelectric layer 10A can be sufficiently thick to avoid significant frequency variation.

The illustrated IDT electrodes 11A, 13A can in one implementation be a single layer electrode. In another implementation, the IDT electrodes 11A, 13A can optionally be a multilayer electrode with a first layer (e.g., lower electrode layer) and a second layer (e.g., upper electrode layer). The first layer can impact acoustic properties of the SAW resonator 1A. For instance, a thickness of the first layer of the IDT electrodes 11A, 13A can impact resonant frequency of the surface acoustic wave device 1A. The second layer of the IDT electrodes 11A, 13A can impact electrical properties of the SAW resonator 1A. A thickness of the second layer of the IDT electrodes 11A, 13A can impact insertion loss of the SAW resonator 1A. The thickness of the second layer of the IDT electrodes 11A, 13A may not significantly impact acoustic properties of the SAW resonator 1A.

In some implementations, the IDT 12A of the surface acoustic wave resonator 1A includes separate IDT layers that impact acoustic properties and electrical properties, respectively. Accordingly, electrical properties, such as insertion loss, can be improved by adjusting one of the IDT layers without significantly impacting acoustic properties.

The IDT 12A can include any suitable material. For example, the IDT 12A may include one or more other metals, such as copper (Cu), Magnesium (Mg), titanium (Ti), molybdenum (Mo), tungsten (W), aluminum (Al), etc. The IDT 12A may include alloys, such as AlMgCu, AlCu, etc. Although embodiments disclosed herein include IDT electrodes 11a, 13a with a single IDT layer, in other implementations the IDT electrodes 11A, 13A can have more than one layer (e.g., two IDT layers, three IDT layers).

The temperature compensation layer 14A can include any suitable temperature compensation material. For example, the temperature compensation layer 14A can be a silicon dioxide ($SiO_2$) layer. The temperature compensation layer 14A can be a layer of any other suitable material having a positive temperature coefficient of frequency for SAW resonators with a piezoelectric layer having a negative coefficient of frequency. For instance, the temperature compensation layer 14A can be a tellurium dioxide ($TeO_2$) layer or a silicon oxyfluoride (SiOF) layer in certain applications. A temperature compensation layer 14 can include any suitable combination of $SiO_2$, $TeO_2$, and/or SiOF.

The temperature compensation layer 14A can bring the temperature coefficient of frequency (TCF) of the SAW resonator 1A closer to zero relative to a similar SAW resonator without the temperature compensation layer 14A. The temperature compensation layer 14A together with a lithium niobate piezoelectric layer 10A can improve the electromechanical coupling coefficient ($k^2$) of the SAW resonator 1A relative to a similar SAW resonator with a lithium tantalate piezoelectric layer 10A and without the temperature compensation layer. This advantage of the temperature compensation layer 14A can be more pronounced when the SAW resonator 1A includes an LN layer as the piezoelectric layer 10A. The temperature compensation layer 10A has a thickness in a range from 0.1L to 0.5L. For instance, the thickness can be about 0.3L in certain applications. For example, when the wavelength L is 4 µm, the thickness of the temperature compensation layer 14A can be 1200 nm.

In some implementations of the illustrated SAW resonator 1A of FIGS. 4A-4B, an optional dispersion adjustment layer (not shown) can be disposed entirely over an upper surface of the temperature compensation layer 14A. In one implementation the dispersion adjustment layer can be a SiN layer. However, a SiN layer may be partially disposed over the upper surface of the temperature compensation layer 14A. In some instances, IDT electrodes 11A, 13A can include fingers 22A having the SiN layer over an active region and border regions free from SiN. The SiN layer can cause a magnitude of the velocity in the underlying region of the SAW resonator 1A to be increased. In certain applications, the dispersion adjustment layer can include another suitable material in place of an SiN layer to increase the magnitude of the velocity of the underlying region of the SAW resonator 1A. According to some applications, the dispersion adjustment layer can include SiN and another material. The dispersion adjustment layer can also function as a passivation layer.

In certain applications, the mass loading strip(s) 16A can include a high density metal strip layer of any suitable metal that has a density that is equal to or greater than the density of a first layer (or the lower electrode layer) of the IDT electrodes 11A, 13A. The conductive or mass loading strip(s) 16A can include a layer having a density at least as high as a density of a material of said first layer. For example, the high density metal strip layer can include molybdenum (Mo), tungsten (W), gold (Au), silver (Ag), ruthenium (Ru), iridium (Ir), or the like, depending on the density of the first layer of the IDT electrodes 11A, 13A.

The mass loading strip(s) 16A has an inner edge 17A and an outer edge 18A. The outer edge 18A of the mass loading strip 16A are illustrated as being aligned with the distal ends 25A of the fingers 22 having a gap 28A between the outer edge 18A and the bus bar 24A. The mass loading strip 16A has a width w1 from the inner edge 17A to the outer edge 18A of the mass loading strip 16A. For example, the width w1 of the mass loading strip can be in a range from 0.5L to 1.5L. The gap 28A has a width w2 from the outer edge 18A and the bus bar 24A. For example, the width w2 of the gap can be greater than 0.9L.

The mass loading strip(s) 16A has a thickness t4. The thickness t4 of the mass loading strip 16A can be selected based on a wavelength λ or L of a surface acoustic wave generated by the surface acoustic wave resonator 1A. For example, the thickness t4 of the mass loading strip 16A can be in a range from 0.01L to 0.03L in certain applications.

FIGS. 5A-5B illustrate a SAW resonator 1B. FIG. 5A illustrates a top view of a portion of the SAW resonator 1B. FIG. 5B illustrates a cross-sectional view of the SAW resonator 1B. FIG. 5C shows a graph of phase velocity versus y-position for the SAW resonator 1B. Some of the features of the SAW resonator 1B is similar to features of the SAW resonator 1A of FIGS. 4A-4B. Thus, reference numerals used to designate the components of the SAW resonator 1B are identical to those used for identifying the corresponding components of the SAW resonator 1A in FIGS. 4A-4B, except that "A" is replaced with "B" in the numerical identifier. Therefore, the structure and description above for the features of the SAW resonator 1A in FIGS. 4A-4B are understood to also apply to the corresponding features of the SAW resonator 1B in FIGS. 5A-5B, except as described below.

The SAW resonator 1B differs from the SAW resonator 1A in that the mass loading strip(s) 16B have a width w1' that is wider than the width w1 of the mass loading strip(s) 16A. In one example, the mass loading strip(s) 16B can be conductive strips (e.g., made of metal). In another example, the mass loading strip(s) 16B can be a heavy strip of dielectric material.

The IDT 12B is or includes a pair of IDT electrodes 11B, 13B, each of which has a bus bar 24b and fingers 22B extending from the bus bar 24B to distal ends 25B (e.g., define two interlocking comb-shaped arrays of metallic electrodes). The mass loading strip(s) 16B have a width w1' that allows the mass loading strip(s) 16B to cover the edge portion 29B of the fingers 22B of the interdigital transducer (IDT) electrodes 11B, 13B, and so that a portion of the mass loading strip(s) 16B extends into the gap region 28B (e.g., so that the outer edge 18B of the mass loading strip(s) 16B is disposed between the distal ends 25B of the fingers 22B and the bus bar 24B). Accordingly, the width w2' between the outer edge 18B of the mass loading strip(s) 16B and the bus bar 24B is smaller than the width w2 in the SAW resonator 1A. The mass loading strip(s) 16B are buried (e.g. embedded) in the temperature compensation layer 14B.

The larger width w1' of the mass loading strip(s) 16B of the SAW resonator 1B advantageously maintain coverage of the edge portion 29B even when there is a misalignment (e.g., masking misalignment) when forming the mass loading strip(s) 16B between the mass loading strip(s) 16B and the edge portion 29B. Additionally, the larger width w1' of the mass loading strip(s) 16B provide a smoothing effect on the phase velocity in the active region of the IDT electrode 12B. As shown in FIG. 5C, the graph of phase velocity versus y position shows a step change between the outer edge 18B and inner edge of the mass loading strip(s) 16B, thereby smoothing the velocity change in the active region of the IDT electrodes 11B, 13B. Further, as the edge portion 29B has a significant influence on suppression of the transverse mode, the larger width w1' of the mass loading strip(s) 16B maintains the edge portion 29B of the fingers 22B of the IDT electrodes 11B, 13B covered, thereby suppressing the transverse mode.

FIGS. 6A-6B illustrate the SAW resonator 1B. FIG. 6A illustrates a top view of a portion of the SAW resonator 1B. FIG. 6B illustrates a cross-sectional view of the SAW resonator 1B. As shown in FIGS. 6A-6B, one or both of the width w1' of the mass loading strip(s) 16B and a positioning X of the mass loading strip(s) 16B can be varied in different implementations. For example, the mass loading strip(s) 16B can be positioned or shifted X further outward toward the bus bars 24B so that more of the mass loading strip(s) 16B extends into the gap region 28B (e.g., so that the outer edge 18B of the mass loading strip(s) 16B is disposed between the bus bar 24B and the distal ends 25B of the fingers 22B of the IDT electrodes 11B, 13B). In other implementations, the mass loading strip(s) 16B can be positioned or shifted inward away from the bus bars 24B so that less of the mass loading strip(s) 16B extends into the gap region 28B.

Conventional mass loading strip(s) 16A (see FIGS. 4A-4B) can have a width w1 of 0.40L (e.g., about 1.6 µm), and the mass loading strips(s) 16A can be positioned so that the outer edge 18A of the mass loading strip(s) 16A align with the distal ends 25A of the fingers 22A of the IDT electrodes 11A, 13A (e.g., the mass loading strip(s) 16A are positioned or shifted X by 0 amount).

As noted above, the width w1' of the mass loading strip(s) 16B is greater than the width w1 of the mass loading strip(s) 16A. The width w1' of the mass loading strip(s) 16B can be greater than 0.4L (e.g., about 1.6 µm), such as between 0.40L (1.6 µm) and about 0.55L (e.g., about 2.2 µm). In one example, the width w1' of the mass loading strip(s) 16B can be 0.45L (1.8 µm). In another example, the width w1' of the mass loading strip(s) 16B can be 0.50L (2.0 µm). In still another example, the width w1' of the mass loading strip(s) 16B can be 0.55L (2.2. µm). However, the width w1' of the mass loading strip(s) 16B can have other suitable lengths.

In some implementations, the mass loading strip(s) 16B can be positioned or shifted X further outward toward the bus bars 24B (e.g., the outer edge 18B of the mass loading strip(s) 16B are in the gap region 28B) by up to 20% of the width of the gap region 28B). In one example, the mass loading strip(s) 16B can be positioned or shifted X by 5% (e.g., about 0.2 µm) into the gap region 28B. In another example, the mass loading strip(s) 16B can be positioned or shifted X by 10% (e.g., about 0.4 µm) into the gap region 28B. In another example, the mass loading strip(s) 16B can be positioned or shifted X by 20% (e.g., about 0.8 µm) into the gap region 28B. However, the mass loading strip(s) 16B can be positioned or shifted by other amounts into the gap region 28B.

Figure 7A:
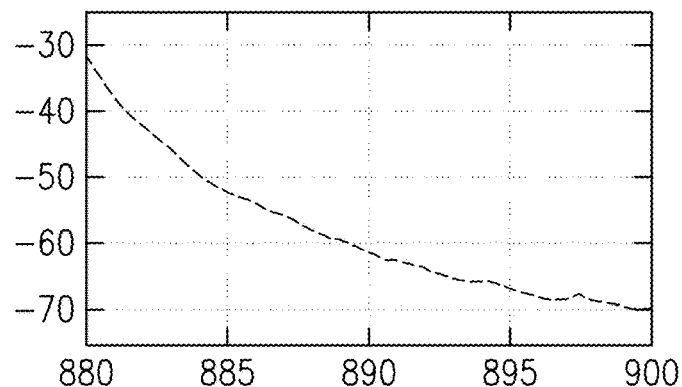
FIG. 7A shows a graphs of a measured admittance of a conventional SAW resonator with conductive strips aligned with the ends of the fingers of the IDT electrode.

FIG. 7A shows a graph of admittance for SAW resonator 1A, where the mass loading strip(s) 16A have a width w1 of 0.4L (1.6 µm) and the outer edge 18A of the mass loading strip(s) 16A are aligned with the distal ends 25A of the fingers 22A of the IDT electrodes 11A, 13A (e.g., the mass loading strip(s) 16A are positioned or shifted X by an amount of 0% or 0 µm).

Figure 7B:
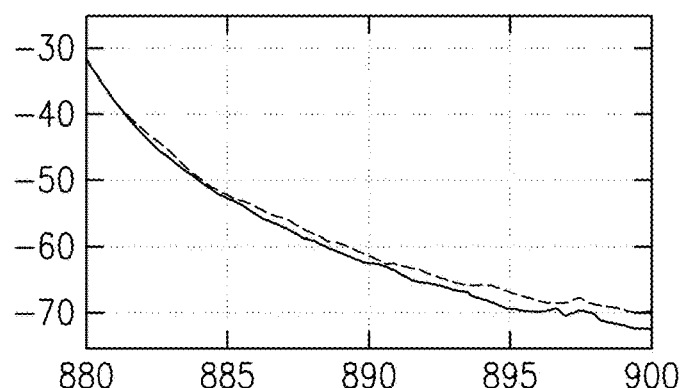
FIGS. 7B-7C shows graphs of a measured admittance a SAW resonator with differing widths and locations for the conductive strips of the SAW resonator.
Figure 7C:
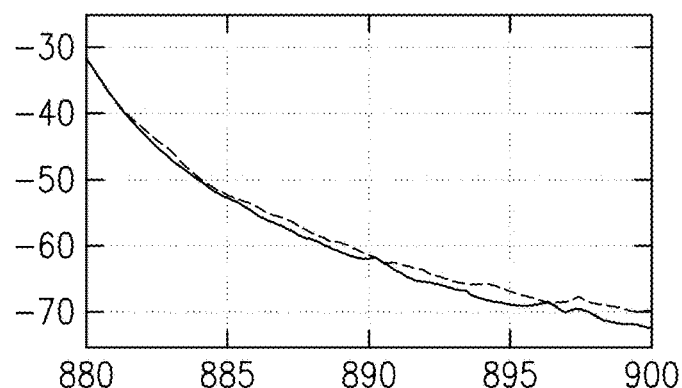

FIG. 7B shows a graph of admittance for SAW resonator 1B, compared with the graph in FIG. 7A, where the mass loading strip(s) 16B have a width w1' of 0.45L (1.8 µm) and the mass loading strip(s) 16B are positioned or shifted X by 10% (e.g., about 0.4 µm) into the gap region 28B. FIG. 7C shows a graph of admittance for SAW resonator 1B, compared with the graph in FIG. 7A, where the mass loading strip(s) 16B have a width w1' of 0.50L (2.2 µm) and the mass loading strip(s) 16B are positioned or shifted X by 20% (e.g., about 0.8 µm) into the gap region 28B. Both FIGS. 7B and 7C show increased suppression of the transverse mode as compared to the graph of FIG. 7A.

The mass loading or conductive strip(s) 16, 16', 16A, 16B disclosed herein can be disposed at any suitable position that is a distance h from the piezoelectric layer 10, 10A, 10B (see FIGS. 2B, 4B, 5B, 6B), or from the lower surface of the temperature compensation layer 14, 14A, 14B. The distance h may be selected relative to the thickness t1 of the temperature compensation layer 14, 14A, 14B. For example, the distance h can be in a range from 0.2×t1 to 0.8×t1 in some embodiments, in which t1 is the thickness of the temperature compensation layer 14, 14A, 14B. In implementations that include a dispersion adjustment layer disposed over the temperature compensation layer 14, 14A, 14B, it may be preferable for the distance h to be in a range from 0.4×t1 to 0.6×t1.

A method of manufacturing an acoustic wave resonator, such as the SAW resonator 1, 1', 1A, 1B above, according to an embodiment, will now be described. The method can include forming or providing an acoustic wave resonator structure with a temperature compensation layer over an interdigital transducer electrode. The interdigital transducer electrode is positioned on a piezoelectric layer. The interdigital transducer electrode includes fingers extending from a bus bar. The fingers each include an edge portion and a body portion. The method includes forming a mass loading strip (e.g., a conductive strip, such as a metal strip) that overlaps with the edge portions of the fingers of the interdigital transducer electrode. The conductive strip includes a layer having a density at least as high as a density of a material of the interdigital transducer electrode that is in contact with the piezoelectric layer. A portion of the temperature compensation layer is positioned between the conductive strip and the interdigital transducer electrode. Forming the conductive strip may include depositing a second layer of the conductive strip over the piezoelectric layer such that the second layer is positioned between the piezoelectric layer and the layer of the conductive strip.

A method of filtering a radio frequency signal according to an embodiment will now be described. The method includes receiving a radio frequency signal at an input port of an acoustic wave filter that includes an acoustic wave resonator (e.g., SAW resonator 1, 1', 1B). The acoustic wave resonator (e.g., SAW resonator 1, 1', 1B) includes a piezoelectric layer, an interdigital transducer electrode on the piezoelectric layer, and a conductive strip that overlaps edge portions of fingers of the interdigital transducer electrode.

The conductive strip includes a layer having a density that is at least as high as a density of a material of the interdigital transducer electrode that is in contact with the piezoelectric layer. The method also includes filtering the radio frequency signal with the acoustic wave filter. The filtering includes suppressing a transverse mode using the conductive strip of the acoustic wave resonator. The filtering can be performed, for example, with the transmit filter 45 of FIG. 8 or the receive filter 50 of FIG. 9.

FIG. 8 is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. Some or all of the SAW resonators TS1 to TS7 and/or TP1 to TP5 can be a SAW resonators with a conductive strip for transverse mode suppression, such as SAW resonator 1B, in accordance with any suitable principles and advantages disclosed herein. For instance, one or more of the SAW resonators of the transmit filter 45 can be a surface acoustic wave resonator 1B of FIGS. 5A-5B and 6A-6B. Alternatively or additionally, one or more of the SAW resonators of the transmit filter 45 can be any surface acoustic wave resonator disclosed herein, such as SAW resonator 1, 1'. Any suitable number of series SAW resonators and shunt SAW resonators can be included in a transmit filter 45.

FIG. 9 is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. Some or all of the SAW resonators RS1 to RS8 and/or RP1 to RP6 can be SAW resonators with a conductive strip for transverse mode suppression, such as SAW resonator 1B, in accordance with any suitable principles and advantages disclosed herein. For instance, one or more of the SAW resonators of the receive filter 50 can be a surface acoustic wave resonator 1B of FIGS. 5A-5B and 6A-6B. Alternatively or additionally, one or more of the SAW resonators of the receive filter 50 can be any surface acoustic wave resonator disclosed herein, such as SAW resonator 1, 1'. Any suitable number of series SAW resonators and shunt SAW resonators can be included in a receive filter 50.

Figure 10:
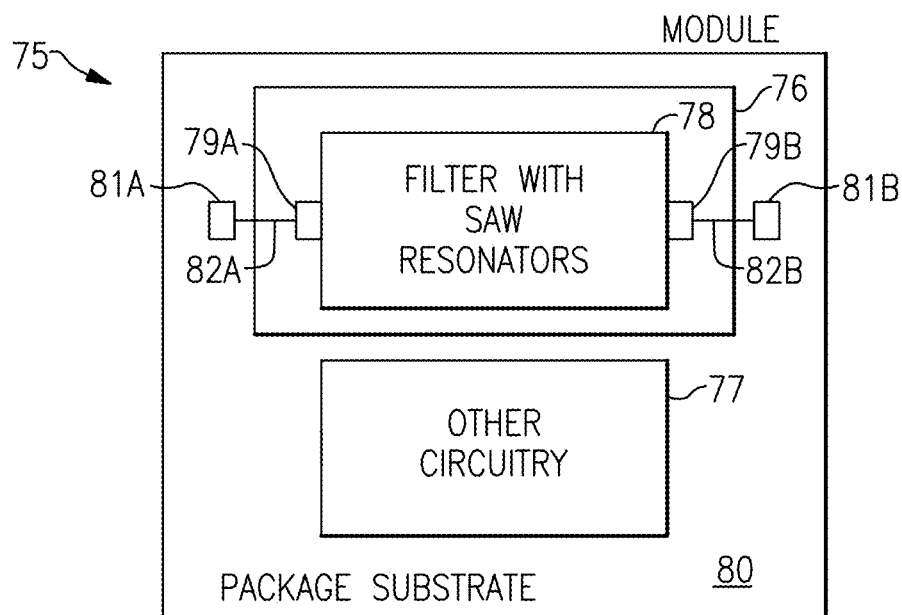
FIG. 10 is a schematic diagram of a radio frequency module that includes a surface acoustic wave component according to an embodiment.

FIG. 10 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators disclosed herein, such as SAW resonator 1, 1', 1B described above. The SAW component 76 can include a SAW die that includes SAW resonators.

The SAW component 76 shown in FIG. 10 includes a filter 78 and terminals 79A and 79B. The filter 78 includes SAW resonators. One or more of the SAW resonators can be implemented in accordance with any suitable principles and advantages of the surface acoustic wave resonator 1, 1', 1B of FIGS. 1-2B, 5A-5B and 6A-6B and/or any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 10. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

Figure 11:
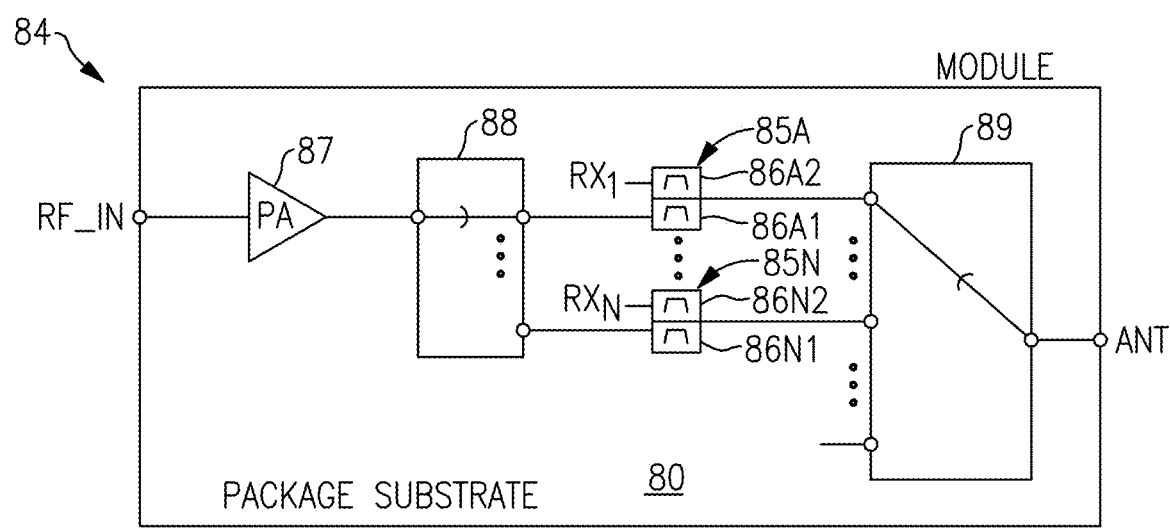
FIG. 11 is a schematic diagram of a radio frequency module that includes filters with surface acoustic wave resonators according to an embodiment.

FIG. 11 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 11 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 12:
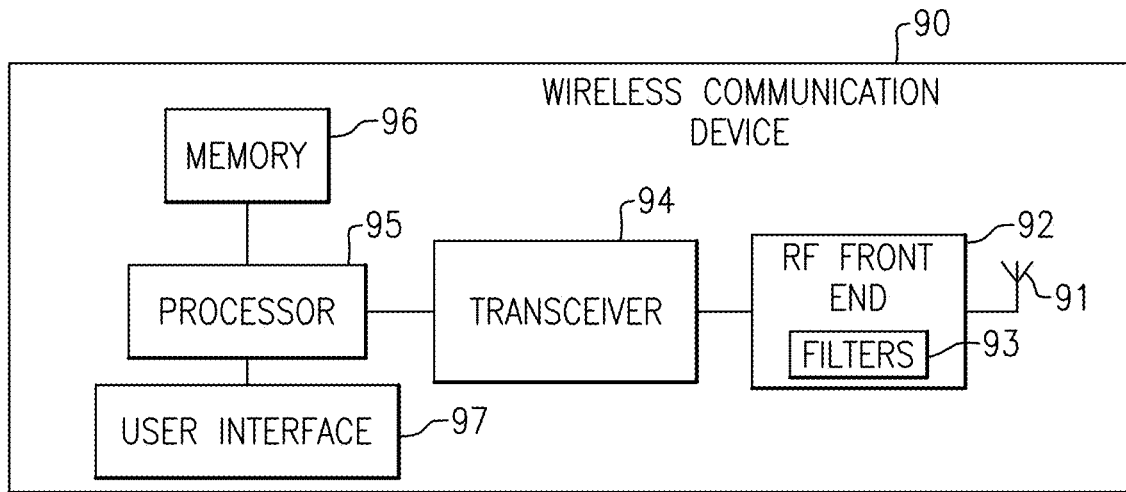
FIG. 12 is a schematic block diagram of a wireless communication device that includes a filter in accordance with one or more embodiments.

FIG. 12 is a schematic diagram of a wireless communication 90 device that includes filters 93 in a radio frequency front end 92 according to an embodiment. The front end 92 can be a front end module. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 13:
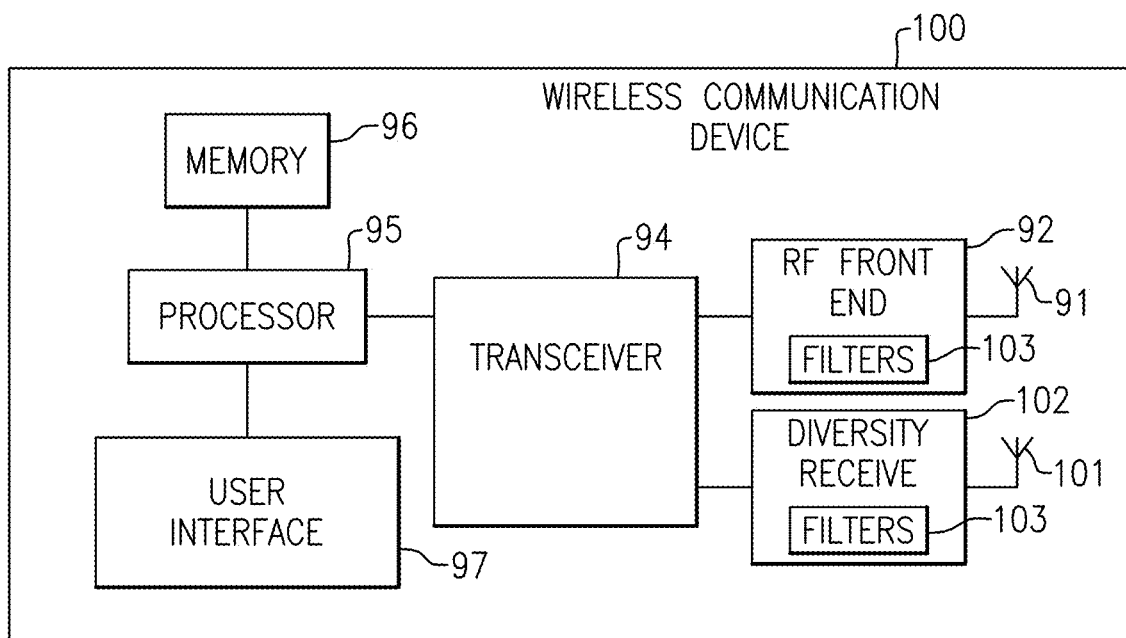
FIG. 13 is a schematic block diagram of another wireless communication device that includes a filter in accordance with one or more embodiments.

FIG. 13 is a schematic diagram of a wireless communication device 100 that includes filters 93 in a radio frequency front end 92 and a second filter 103 in a diversity receive module 102. The wireless communication device 100 is like the wireless communication device 90 of FIG. 12, except that the wireless communication device 100 also includes diversity receive features. As illustrated in FIG. 13, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators, such as Lamb wave resonators and/or boundary wave resonators. For example, any suitable combination of features of the conductive strips disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic resonators in accordance with any suitable principles and advantages disclosed herein. FR1 can be from 410 MHz to 7.125 GHz, for example, as specified in a current 5G NR specification. An acoustic wave filter in accordance with any suitable principles and advantages disclosed herein can be arranged to filter a radio frequency signal in a fourth generation (4G) Long Term Evolution (LTE) operating band and/or in a filter having a passband that includes a 4G LTE operating band and a 5G NR operating band.

Aspects of this disclosure can be implemented in electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of certain embodiments described above can be combined to provide further embodiments. The accompanying claims and their equivalents are intended to cover such forms or modifications as would fall within the scope and spirit of the disclosure.

What is claimed is:

1. A surface acoustic wave resonator comprising:
an interdigital transducer electrode extending along a first length and including a bus bar and one or more fingers extending from the bus bar to an edge portion; and
a mass loading strip overlapping the edge portion of the one or more fingers, the mass loading strip extending from a proximal end to a distal end along a second length shorter than the first length to thereby suppress a hyperbolic mode of the interdigital transducer electrode.

2. The surface acoustic wave resonator of claim 1 wherein the mass loading strip is a conductive strip.

3. The surface acoustic wave resonator of claim 1 wherein the mass loading strip includes dielectric material.

4. The surface acoustic wave resonator of claim 1 wherein the second length is shorter than the first length by at least 1% of the first length.

5. The surface acoustic wave resonator of claim 4 wherein the second length is shorter than the first length by between 1% and 20% of the first length.

6. The surface acoustic wave resonator of claim 4 wherein the second length is shorter than the first length by 4% of the first length.

7. The surface acoustic wave resonator of claim 1 wherein the second length is shorter than the first length by 10% of the first length.

8. The surface acoustic wave resonator of claim 1 wherein a material of the interdigital transducer electrode includes tungsten.

9. The surface acoustic wave resonator of claim 1 wherein a material of the mass loading strip includes tungsten.

10. The surface acoustic wave resonator of claim 1 wherein the mass loading strip includes one or more of gold, silver, molybdenum or ruthenium.

11. The surface acoustic wave resonator of claim 1 wherein the interdigital transducer electrode is disposed on a piezoelectric layer.

12. The surface acoustic wave resonator of claim 11 wherein the piezoelectric layer is a lithium niobate layer.

13. The surface acoustic wave resonator of claim 11 further comprising a temperature compensation layer disposed over the interdigital transducer electrode.

14. The surface acoustic wave resonator of claim 13 wherein the mass loading strip is embedded in the temperature compensation layer.

15. The surface acoustic wave resonator of claim 14 wherein the temperature compensation layer is a silicon dioxide layer.

16. The surface acoustic wave resonator of claim 1 wherein the surface acoustic wave resonator is configured to generate a surface acoustic wave.

17. An acoustic wave filter comprising:
a surface acoustic wave resonator configured to filter a radio frequency signal, the surface acoustic wave resonator including an interdigital transducer electrode extending along a first length and including a bus bar and one or more fingers extending from the bus bar to an edge portion, and a mass loading strip overlapping the edge portion of the one or more fingers, the mass loading strip extending from a proximal end to a distal end along a second length shorter than the first length to thereby suppress a hyperbolic mode of the interdigital transducer electrode.

18. The acoustic wave filter of claim 17 wherein the mass loading strip is a conductive strip.

19. A radio frequency module comprising:
a package substrate;
a surface acoustic wave component including one or more surface acoustic wave resonators configured to filter a radio frequency signal, each surface acoustic wave resonator including an interdigital transducer electrode extending along a first length and including a bus bar and one or more fingers extending from the bus bar to an edge portion, and a mass loading strip overlapping the edge portion of the one or more fingers and extending along a second length shorter than the first length to thereby suppress a hyperbolic mode of the interdigital transducer electrode; and
additional circuitry, the surface acoustic wave component and additional circuitry disposed on the package substrate.

20. The radiofrequency module of claim 19 wherein the mass loading strip is a conductive strip.

21. The radio frequency module of claim 19 wherein the additional circuitry includes a multi-throw radio frequency switch.

22. The radio frequency module of claim 19 wherein the additional circuitry includes a power amplifier.

23. A wireless communication device comprising:
an antenna; and
a front end module including one or more surface acoustic wave resonators configured to filter a radio frequency signal associated with the antenna, each surface acoustic wave resonator including an interdigital transducer electrode extending along a first length and having a bus bar and one or more fingers extending from the bus bar to an edge portion, and a mass loading strip overlapping the edge portion of the one or more fingers and extending along a second length shorter than the first length to thereby suppress a hyperbolic mode of the interdigital transducer electrode.

24. The wireless communication device of claim 23 wherein the mass loading strip is a conductive strip.

\* \* \* \* \*

UNITED STATES PATENT AND TRADEMARK OFFICE
CERTIFICATE OF CORRECTION

PATENT NO. : 11,848,658 B2
APPLICATION NO. : 17/075039
DATED : December 19, 2023
INVENTOR(S) : Hiramatsu et al.

It is certified that error appears in the above-identified patent and that said Letters Patent is hereby corrected as shown below:

In the Specification

On Column 6, Line 64: Delete "λ," and insert -- λ --.

On Column 7, Line 63: Delete the second occurrence "1'" and insert -- 1''' --.

On Column 9, Line 23: Delete "FIG." and insert -- FIGS. --.

On Column 11, Line 19: Delete "11a, 13a" and insert -- 11A, 13A --.

On Column 12, Line 56: Delete "24b" and insert -- 24B --.

In the Claims

On Column 20, Line 66: In Claim 20, delete "radiofrequency" and insert -- radio frequency --.

Signed and Sealed this
Twentieth Day of February, 2024

Katherine Kelly Vidal
*Director of the United States Patent and Trademark Office*